United States Patent [19]
Asada

[11] Patent Number: 6,133,968
[45] Date of Patent: Oct. 17, 2000

[54] LIQUID CRYSTAL DISPLAY PANEL

[75] Inventor: Katsushige Asada, Kawasaki, Japan

[73] Assignee: Fujitsu Limited, Kawasaki, Japan

[21] Appl. No.: 09/248,652

[22] Filed: Feb. 11, 1999

[30] Foreign Application Priority Data

Jul. 31, 1998 [JP] Japan ................................. 10-218055

[51] Int. Cl.[7] .......................... G02F 1/136; G02F 1/1343; H01L 29/04
[52] U.S. Cl. .............................. 349/43; 349/139; 257/57; 257/59
[58] Field of Search ................................ 349/43, 139, 42; 257/57, 56, 59

[56] References Cited

U.S. PATENT DOCUMENTS

| | | | |
|---|---|---|---|
| 5,235,448 | 8/1993 | Suzuki et al. ............................ | 349/43 |
| 5,416,340 | 5/1995 | Yoshida et al. ........................... | 257/59 |
| 5,929,489 | 7/1999 | Deane ...................................... | 257/59 |
| 5,965,916 | 10/1999 | Chen ....................................... | 257/59 |
| 6,011,277 | 1/2000 | Yamazaki et al. ....................... | 257/59 |

*Primary Examiner*—William L. Sikes
*Assistant Examiner*—Toan Ton
*Attorney, Agent, or Firm*—Greer, Burns & Crain, Ltd.

[57] ABSTRACT

A liquid crystal display panel includes a liquid crystal interposed between the pair of substrates. One substrate has gate bus lines, drain bus lines, pixel electrodes 22 and thin film transistors. Each thin film transistor includes a gate electrode connected to the gate bus line, a gate insulation layer, a semiconductor active layer, a channel protective layer, a drain electrode formed as a part of the straight drain bus line and a source electrode. The drain electrode and/or the source electrode have at least one cut-out portion at a position overlapping with an end surface of the semiconductor active layer, to increase the distance between the electrical contact point of the semiconductor active layer and the electrical contact point of the source electrode with the semiconductor active layer.

5 Claims, 8 Drawing Sheets

LIQUID CRYSTAL DISPLAY PANEL

BACKGROUND OF THE INVENTION

1. Field of the Invention

The present invention relates to an active matrix-driven type liquid crystal display panel.

2. Description of the Related Art

A liquid crystal display panel includes a liquid crystal interposed between a pair of substrates and forms an image by the application of voltages. The active matrix-driven type liquid crystal display panel includes a plurality of thin film transistors (TFT) as active elements. The thin film transistors are formed on one of the substrates together with gate bus lines, drain bus lines and pixel electrodes.

Each of the thin film transistors is provided with a gate electrode connected to the gate bus line, a gate insulation layer, a semiconductor active layer, a channel protective film, a drain electrode connected to the drain bus line and a source electrode connected to the pixel electrode. The channel protective film covers a central portion of the semiconductor active layer, and the drain electrode and the source electrode are connected to the semiconductor active layer on the outside of the channel protective film.

In a typical thin film transistor, an arm or projection extends perpendicular to the gate bus line to provide the gate electrode, while another arm or projection extends perpendicular to the drain bus line to provide the drain electrode. The source electrode is provided on the side of the semiconductor active layer opposite to the drain electrode and is connected to the pixel electrode. In this case, the gate electrode extends inwardly from the gate bus line so as to restrict the area in which the pixel electrode is to be formed, while the drain electrode extends inwardly from the drain bus line to restrict the area in which the pixel electrode is to be formed, thereby reducing an opening degree. Also, if the drain electrode, the source electrode and the joint region of the source electrode with the pixel electrode are aligned on line with each other, the area in which the pixel is to be formed is further restricted to further reduce the opening degree.

Alternatively, there is a case wherein the drain electrode of the thin film transistor is formed by the drain bus line itself. That is, the drain electrode is not formed by an arm or projection extending perpendicular from the drain bus line, but formed as part of a straight drain bus line. Accordingly, the area inside the drain bus line in which the pixel electrode is to be formed is widened to increase the opening size. In this case, if the source electrode is provided in parallel to the drain bus line, the size of the opening is increased.

Recently, there have been demands for liquid crystal display panels having high definition and high opening degree for displaying finer and brighter images, and therefore, the miniaturization of circuit patterns and the reduction in size of thin film transistors have proceeded. With a reduction in the size of the thin film transistors, the distance between an electrical contact point of the drain electrode with the semiconductor active layer and an electrical contact point of the semiconductor active layer with the source electrode is reduced, and static charge entering from the drain bus line may possibly discharge at the semiconductor active layer and break the TFT. Particularly, the drain electrode of the thin film transistor is formed by the drain bus line and, if the drain electrode crosses an end surface of the semiconductor active layer and the crossing point defines an electrical contact point between the drain electrode and the semiconductor active layer, so the distance between the electrical contact point of the drain electrode with the semiconductor active layer and the electrical contact point of the semiconductor active layer with the source electrode becomes extremely short, and therefore, breakage of the TFT is liable to occur.

SUMMARY OF THE INVENTION

The object of the present invention is to provide a liquid crystal display panel providing high precision and a large opening degree as well as being free from the damage to electronic elements due to static charge.

A liquid crystal display panel, according to the present invention, comprises a pair of substrates; a liquid crystal interposed between the pair of substrates; one of the pair of substrate having a plurality of gate bus lines, a plurality of drain bus lines arranged perpendicular to the gate bus line, a plurality of pixel electrodes and a plurality of thin film transistors; each of the thin film transistors comprising a gate electrode connected to the gate bus line, a gate insulation layer, a semiconductor active layer, a channel protective layer, a drain electrode formed by the drain bus line and a source electrode connected to the pixel electrode; and at least one of the drain electrode and the source electrode having at least one cut-out portion at a position overlapping with an end surface of the semiconductor active layer.

In this arrangement, at least one of the drain electrode and the source electrode has at least a cut-out portion at a position overlapping with an end surface of the semiconductor active layer. For instance, as to the drain electrode, the drain electrode is formed as a part of a basically straight drain bus line. Since a cut-out portion is formed in the drain electrode at a position overlapping with the end surface of the semiconductor active layer, the drain electrode is not electrically in contact with the semiconductor active layer in this cut-out portion, but the electrical contact point between the drain electrode and the semiconductor active layer is displaced further from the source electrode. As a result, the distance between the electrical contact point of the drain electrode with the semiconductor active layer and the electrical contact point of semiconductor active layer with the source electrode is prolonged to prevent static charge, conveyed from the drain bus line, from discharging at the semiconductor active layer, and thus damage to the TFT is avoidable.

In this manner, according to the present invention, by providing at least one cutout portion in the drain electrode and/or the source electrode, it is possible to increase the effective distance between the source electrode and the drain electrode during the channel-off or non-driving period, and thereby, it is possible to increase the durability of TFTs in the liquid crystal display panel against voltage due to static charge and to improve the production yield of the panel and the display quality, without increasing production cost by increasing the number of masks and/or reducing the opening degree of the panel.

BRIEF DESCRIPTION OF THE DRAWINGS

The other object and features of the present invention will become more apparent from the following description of the preferred embodiments, with reference to the accompanying drawings, in which.

DESCRIPTION OF THE PREFERRED EMBODIMENTS

Figure 1:
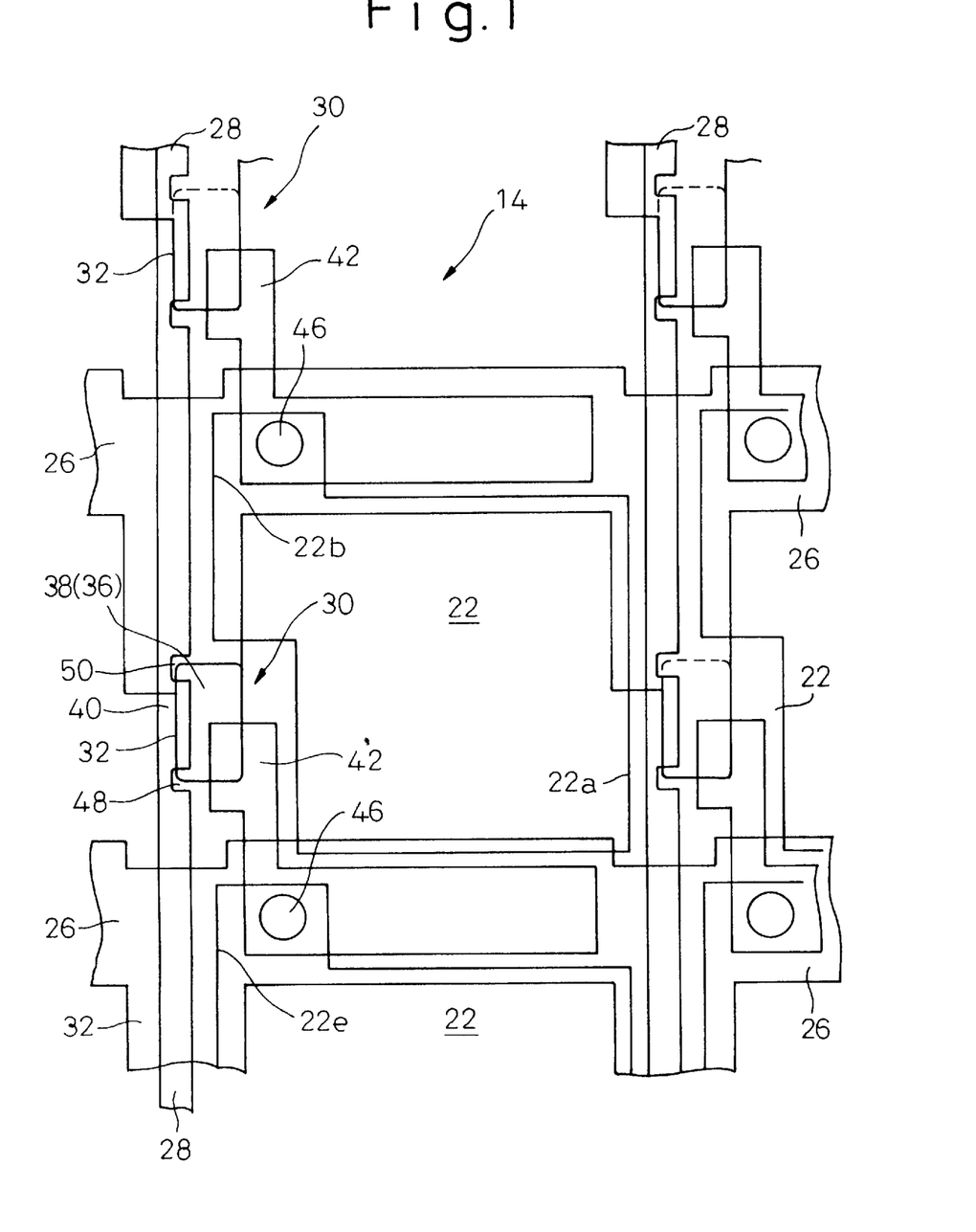
FIG. 1 is a view showing a liquid crystal display panel according to the first embodiment of the present invention.
Figure 2:
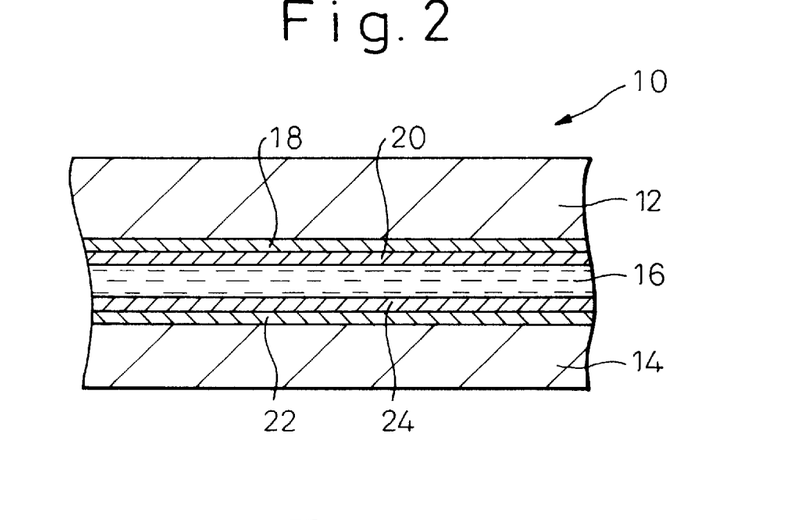
FIG. 2 is a cross-sectional view of the liquid crystal display panel.

FIG. 1 shows a liquid crystal display panel according to the first embodiment of the present invention, and FIG. 2 is a cross-sectional view of the liquid crystal display panel.

In FIG. 2, the liquid crystal panel 10 includes a pair of transparent glass substrates 12 and 14 and a liquid crystal 16 interposed between substrate 12 and 14. The one substrate 12 includes an electrode 18 and an orientation film 20, while the other substrate 14 includes electrodes 22 and an orientation film 24. For example, the electrode 18 of the one substrate 12 is a common electrode, and the electrodes 22 of the other substrate 14 are pixel electrodes. A voltage is applied between the common electrode 18 and the pixel electrode 22 to form an image.

Figure 3:
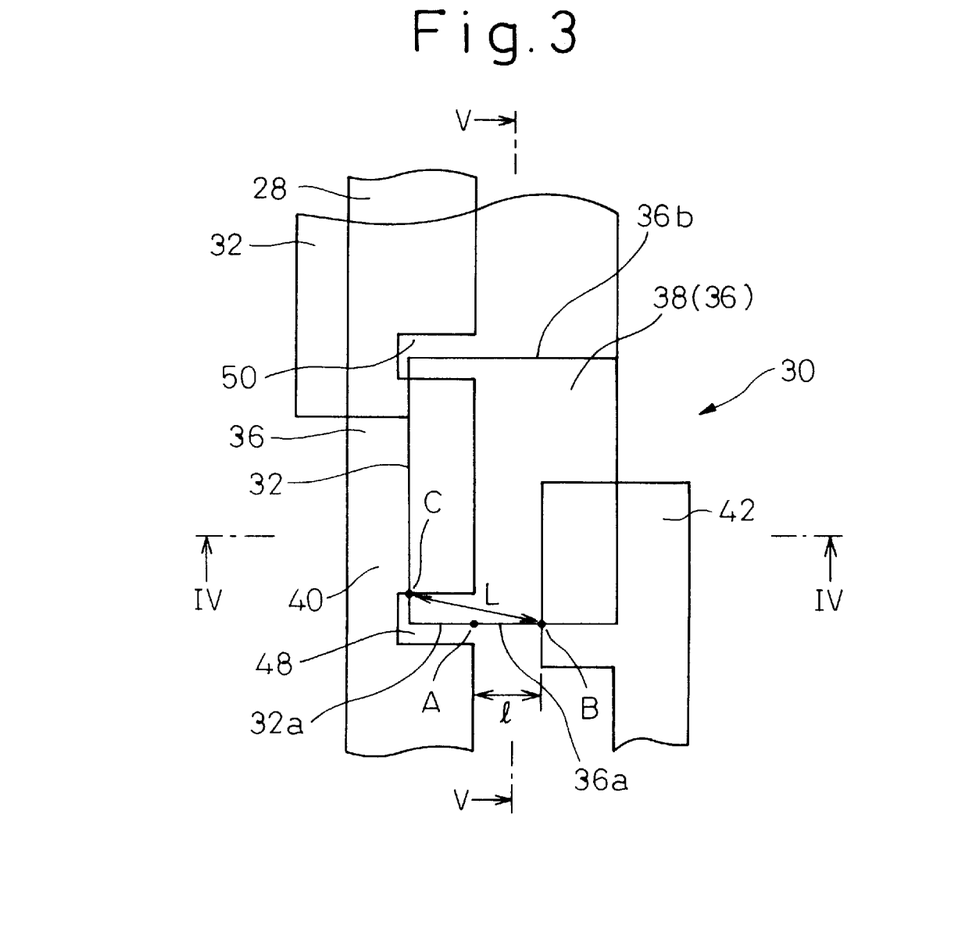
FIG. 3 is an enlarged view of a portion of the panel of FIG. 1 including the thin film transistor.

FIG. 1 shows the construction of an active matrix provided in the substrate 14 having the pixel electrodes 22. FIG. 3 is an enlarged view of a part of one of thin film transistors 30 shown in FIG. 1.

The substrate 14 has a plurality of gate bus lines 26 extending in the line direction, a plurality of drain bus lines 28 extending in the row direction perpendicular to the gate bus lines 26, a plurality of pixel electrodes 22 arranged in zones generally sectioned by the gate bus lines 26 and the drain bus lines 28, and a plurality of thin film transistors (TFT) 30 for driving the pixel electrodes 22.

Figure 4:
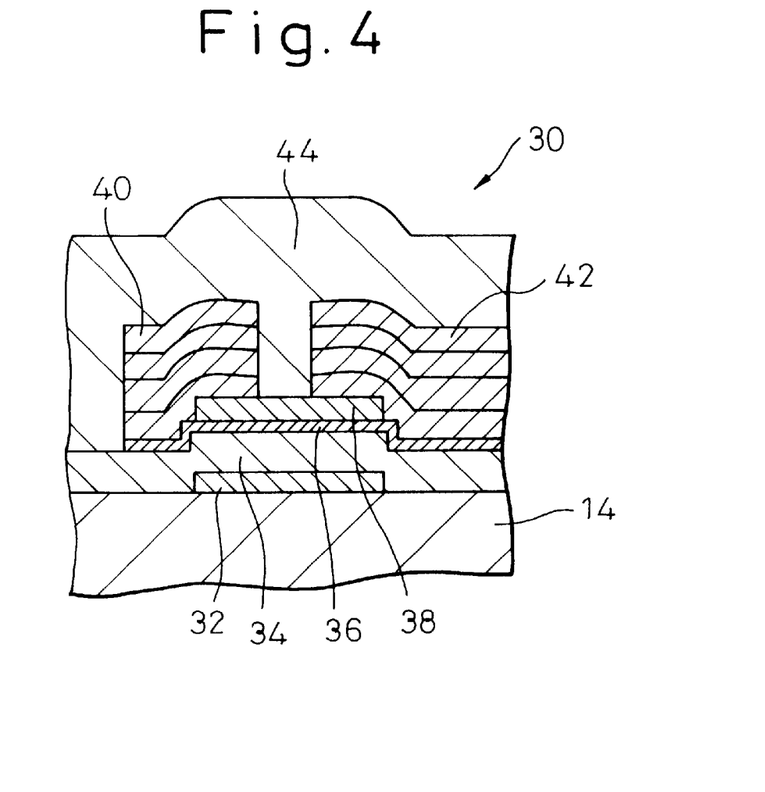
FIG. 4 is a cross-sectional view of the thin film transistor taken along the line IV—IV in FIG. 3.
Figure 5:
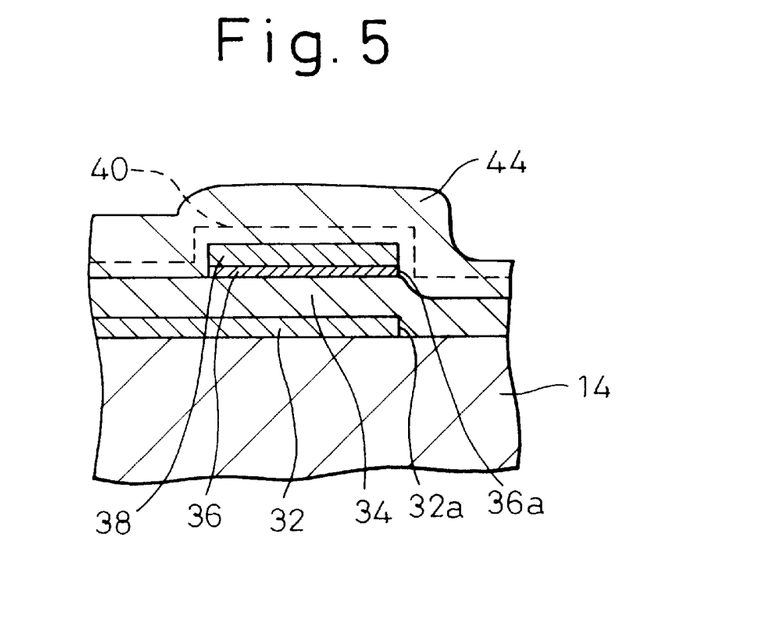
FIG. 5 is a cross-sectional view of the thin film transistor taken along the line V—V in FIG. 3.

FIG. 4 is a cross-sectional view of the thin film transistor, taken along the line IV—IV in FIG. 3, and FIG. 5 is a cross-sectional view of the thin film transistor taken, along line V—V in FIG. 3.

Each of the thin film transistors 30 is provided with a gate electrode 32 connected to the gate bus line 26, a gate insulation layer 34, a semiconductor active layer 36, a channel protective layer 38, a drain electrode 40 formed by the drain bus line 28, and a source electrode 42 connected to the pixel electrode 22. Inner portions of the drain electrode 40 and the source electrode 42 opposed to each other are placed on the channel protective film 38, and outer portions of the drain electrode 40 and the source electrode 42 are in contact with outer portions of the semiconductor active layer 36, respectively. A central portion of the semiconductor active layer 36 defines a channel.

An insulation layer 44 covers the thin film transistor 30 and the bus lines 26 and 28, and the pixel electrode 22 is formed on the insulation layer 44. As shown in FIG. 1, contact holes 46 are provided in the insulation layer 44, and the pixel electrode 22 is connected to the source electrode 42 via the contact hole 46. Further, the orientation film 24 is formed on the substrate 14, as shown in FIG. 2.

For example, the gate bus line 26 and the gate electrode 32 are formed on the surface of the substrate 14 as a Cr layer. The gate insulation layer 34 is an SiN layer; the semiconductor active layer 36 is an a-Si layer; and the channel protective layer 38 is an SiN layer. The drain bus line 28, the drain electrode 40 and the source electrode 42 are of a multi-layered structure of n+a-Si and Ti/Al/Ti.

This active matrix substrate 14 is manufactured by the following steps. (a) A Cr film of 150 nm thick is formed on the glass substrate 14 by a sputtering method to provide the gate bus lines 26 and the gate electrodes 32. (b) The gate insulation film 32 of 400 nm if formed from SiNx, the semiconductor active layer 36 of 30 nm is formed from a-Si and the channel protective layer 38 of 120 nm is formed from SiNx, by successive P-CVD operations to result in a laminated film structure. (c) A resist pattern is formed only on the channel for forming the channel protective film 38, by a self-alignment back surface exposure using the gate electrode 32 and a photo-mask. (d) The channel protective layer 38 is formed by etching using the resist pattern. The resist is subsequently peeled off and removed, and the resultant substrate is etched by diluted hydrofluoric acid for 10 seconds to remove a natural oxide layer on the surface.

(e) The ohmic contact layer of n+a-Si and Ti/Al/Ti are successively formed for the drain bus lines 28, the drain electrodes 40 and the source electrodes 42 to result in a laminated film structure. (f) A resist is patterned in correspondence to the configuration of the drain bus lines 28, the drain electrodes 40 and the source electrodes 40. (g) The layers of Ti/Al/Ti, n+a-Si and a-Si are successively formed by a plasma etching method. (h) The protective layer 44 of SiNx having a thickness of 330 nm is formed by P-CVD method.

(i) A resist is applied to, and conforms to, the patterned contact holes 46. (j) The contact holes 46 are formed by etching the protective layer 44 by a plasma etching method. (k) ITO of 70 nm is formed by a sputtering method. (l) A photoresist is coated all over the surface and patterned to conform to the pixel electrodes 22. (m) ITO is etched by a wet etching method and removed.

As shown in FIGS. 1 and 3, each thin film transistor 30 is located between the adjacent two gate bus lines 26 at a position in the vicinity of the lower gate line 26 (as seen in FIG. 1). The gate electrode 32 extends downward from the upper one (as seen in FIG. 1) of the adjacent two gate bus lines 26 along the drain bus line 28. In FIG. 3, one end surface of the gate electrode 32 is indicated by 32a, and a front end surface of the semiconductor active layer 36 is indicated by 36a. As shown in FIGS. 3 and 5, the front end surface 32a of the gate electrode 32 is located at a position in vertical alignment with the end surface 36a of the semiconductor active layer 36. Similarly, an end surface of the channel protective layer 38 is located at a position in alignment with the end surfaces 32a and 36a. The semiconductor active layer 36 further has another end surface 38b (FIG. 3), and the channel protective layer 36 similarly has another end surface.

As shown in FIG. 1, the adjacent two gate bus lines 26 and the adjacent two gate electrodes 32 define a generally rectangular frame. The pixel electrode 22 has a generally rectangular portion 22a having four sides and a projecting portion 22b projecting from the rectangular portion 22a on an extension of one diagonal line of this rectangular portion 22a. The generally rectangular portion 22a of the pixel electrode 22 is disposed in the rectangular frame, while the projecting portion 22b of the pixel electrode 22 is located at a position overlapping with the gate bus line 26. The contact hole 46 is provided at a position in the projecting portion 22b.

The thin film transistor 30 is formed at a position overlapping with the drain bus line 28. The source electrode 42 is not so projected in the direction parallel to the gate bus line 26 but rather extends downward in parallel to the drain bus line 28. After extending downward, the source electrode 42 is bent at a right angle and extends while being overlapped with the lower gate bus line 26.

In this manner, the gate bus lines 26 and the gate electrodes 32 define a generally rectangular frame and the thin film transistor 30 is formed at a position closer to the drain bus line 28, whereby there are fewer members projected into the interior of a zone in which a pixel opening is to be defined. This enables realization of a liquid crystal display device having a large opening size. Also, since the gate bus line 26 and the gate electrode 32 act as a shading film, there is no need to provide a black matrix as in the prior art, except for an area covering the thin film transistor 30, resulting in a liquid crystal display device having a high opening degree.

As shown in FIGS. 1 and 3, the drain bus line 28 is formed as a basically straight strip-like conductor. The drain electrode 40 does not project laterally from the drain bus line 28, but is constituted as a part of the straight bus line 28. The drain electrode 40 is a portion of the drain bus line 28 located at a position on the thin film transistor 30. The drain electrode 40 (or the drain bus line 28) extends over the semiconductor layer 36 and the channel protective layer 38 while crossing the end surfaces 36a and 36b of the semiconductor active layer 36.

According to the present invention, the drain electrode 40 has cut-out portions or recesses 48 and 50 at positions overlapping with the end surfaces 36a and 36b of the semiconductor active layer 36. The cut-out portions 48 and 50 correspond to notches provided in the side of the drain electrode 40 (or the drain bus line 28) opposed to the source electrode 42 while detouring around the end surfaces 36a and 36b of the semiconductor active layer 36.

The operation of the cut-out portions 48 and 50 will be described below. As shown in FIG. 4, the outer portions of the drain electrode 40 and the source electrode 42 are brought into contact with outer portions of the semiconductor active layer 36, respectively, to define channels therebetween. The inner portions of the drain electrode 40 and the source electrode 42 are placed on the channel protective layer 38, whereby the drain electrode 40 and the source electrode 42 are not brought into electrical contact with the semiconductor active layer 36 on the channel protective layer 38. In addition, if there were no cut-out portions 48 and 50 in the drain electrode 40, the inner portion of the drain electrode 40 would be in contact with the end surface 36a of the semiconductor active layer 36. That is, the inner portion of the drain electrode 40 extends downward at the respective opposite ends, as schematically illustrated in FIG. 5 by a dotted line 40, to be in contact with the end surface 36a of the semiconductor active layer 36.

An example of a contact point of the drain electrode 40 with the end surface 36a of the semiconductor active layer 36 when there are no cut-out portions 48 and 50 in the drain electrode 40 is indicated by A in FIG. 3, while an example of a contact point of the source electrode 42 with the end surface 36a of the semiconductor active layer 36 is indicated by B. As is apparent therefrom, the distance 1 between the contact points A and B is extremely short (the illustrated distance A to B is the shortest distance between the contact points). If the distance from the drain electrode 40 via the semiconductor active layer 36 to the source electrode 42 is small in such a manner, a static charge entering from the drain bus line 28 is discharged at the semiconductor active layer 36 to destroy the thin film transistor 30.

According to the present invention, a cut-out portion 48 is provided in the drain electrode 40 so that the drain electrode 40 is not brought into contact with the end surface 36a of the semiconductor active layer 36 (or the contact point is displaced farther from the source electrode). Thus, the contact point of the drain electrode 40 with the semiconductor active layer 36 is represented by C in FIG. 3 whereby the distance L between the drain electrode 40 and the source electrode 42 via the semiconductor active layer 36 is longer. If this distance L exceeds a certain value, a static charge entering from the drain bus line 28 is absorbed by a capacity of the drain bus line 28 to prevent the thin film transistor 30 from being destroyed. Therefore, the insulation durability is increased against the electrostatic stress.

Also, the other cut-out portion 50 causes the contact point of the drain electrode 40 with the end surface 36b of the semiconductor active layer 36 to shift so that a distance between the drain electrode 40 and the source electrode 42 via the semiconductor active layer 36 increases. In this regard, while the resistance of the drain bus line 28 increases by providing the cut-out portions 48 and 50 in the drain bus electrode 40, this increase in resistance of the drain bus line 28 is within an acceptable range because the cut-out portions 48 and 50 are in an extremely limited area.

In the embodiment, the cut-out portions 48 and 50 are provided in the drain electrode 40 during patterning in the elements separation process (the above-mentioned step. (f)). Thereby, a sufficiently large distance between the source and the drain is realized without any accompanying reduction in the opening degree. Although a similar effect can be realized by narrowing the entire drain bus line, the resistance of the bus line becomes so high that the display quality is deteriorated. According to the present invention, it is possible to improve the durability against static charge imparted at the drain side of the liquid crystal display panel.

Figure 6:
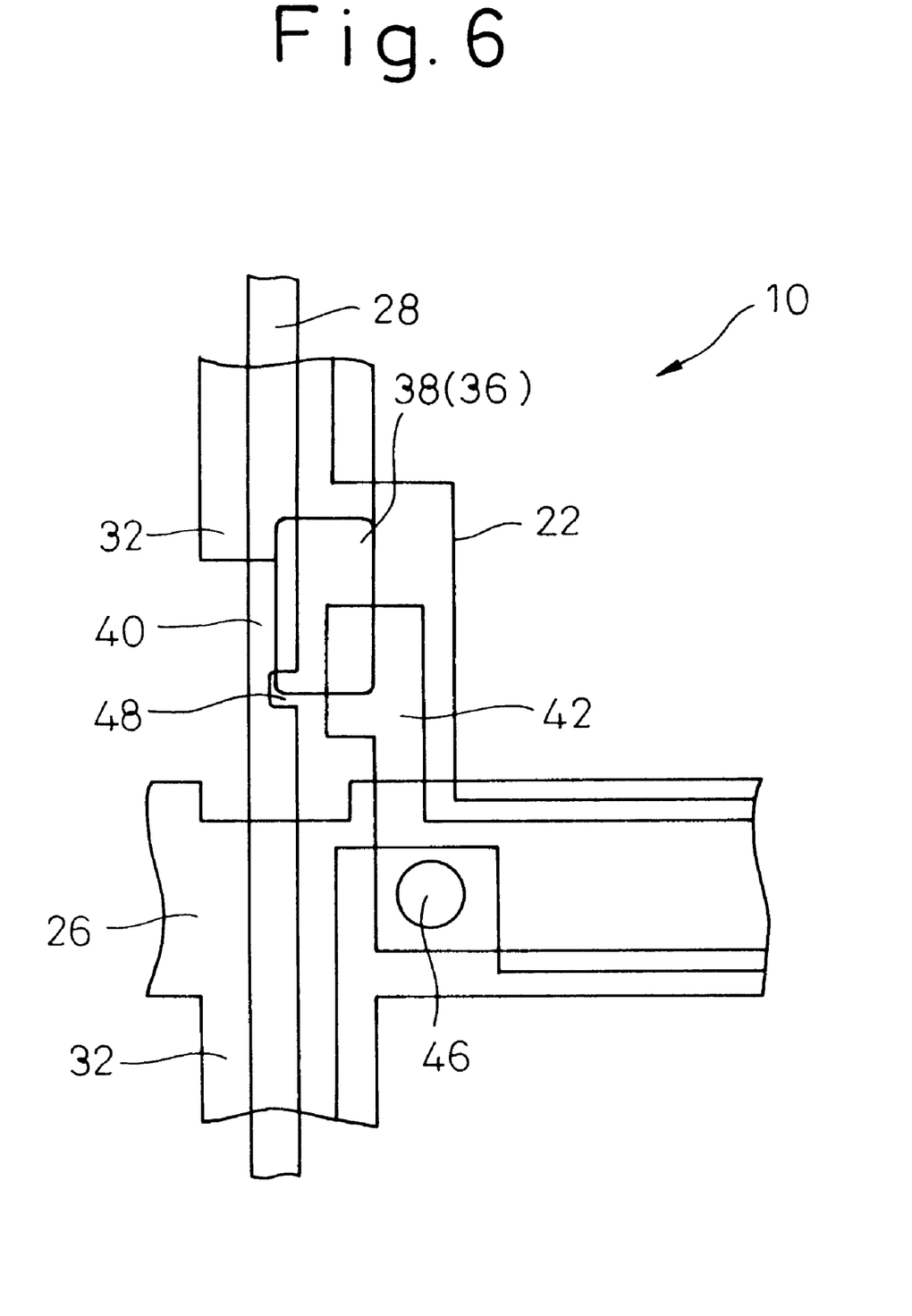
FIG. 6 is a view showing a liquid crystal display panel according to the second embodiment of the present invention.

FIG. 6 shows a liquid crystal display panel according to the second embodiment of the present invention. While two cutout portions 48 and 50 are provided in the drain electrode 40 in the preceding embodiment shown in FIG. 1, one cut-out portion 48 is provided in the drain electrode 40 in this embodiment. This cut-out portion 48 is provided on one side of the semiconductor active layer 36 at which the source electrode 42 crosses the end surface 36a of the semiconductor active layer 36. The operation thereof is substantially the same as in the preceding embodiment.

Figure 7:
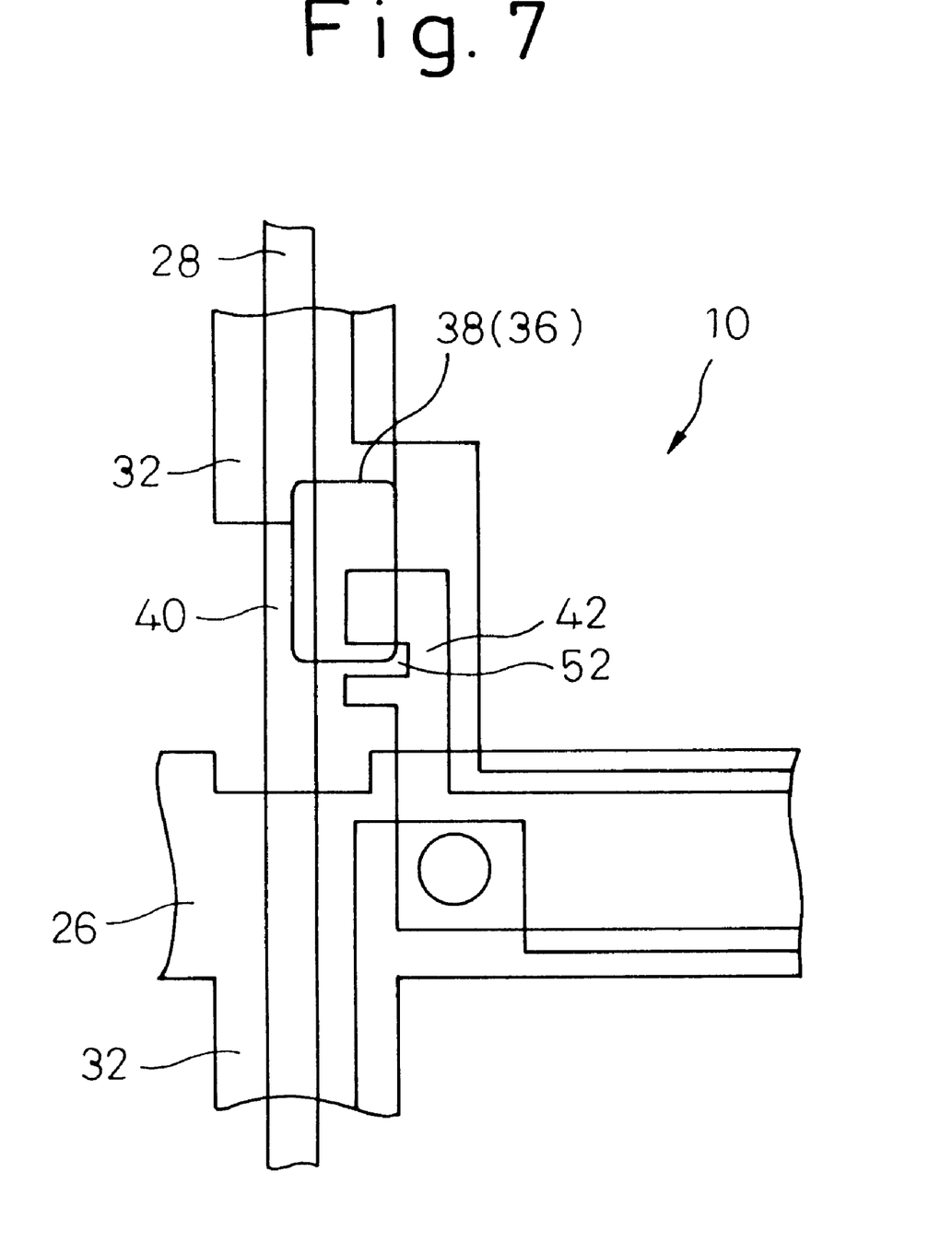
FIG. 7 is a view showing a liquid crystal display panel according to the third embodiment of the present invention.

FIG. 7 shows a liquid crystal display panel according to the third embodiment of the present invention. While cut-out portions 48 and 50 are provided in the drain electrode 40 in the embodiment shown in FIG. 1, one cut-out 52 is provided in the source electrode 42. In this case, the waisted portion 52 causes the contact point of the source electrode 42 with the end surface 36a of the semiconductor active layer 36 to shift farther from the drain electrode 40, and therefore, the distance between the drain electrode 40 and the source electrode 42 via the semiconductor active layer 36 becomes longer to improve the insulation durability of the thin film transistor 30 so that the same is prevented from being destroyed by static charge. This embodiment is suitably applicable when a width of the drain bus line is very small and the bus line resistance significantly increases if the cutout portion is provided in the drain electrode 40.

Figure 8:
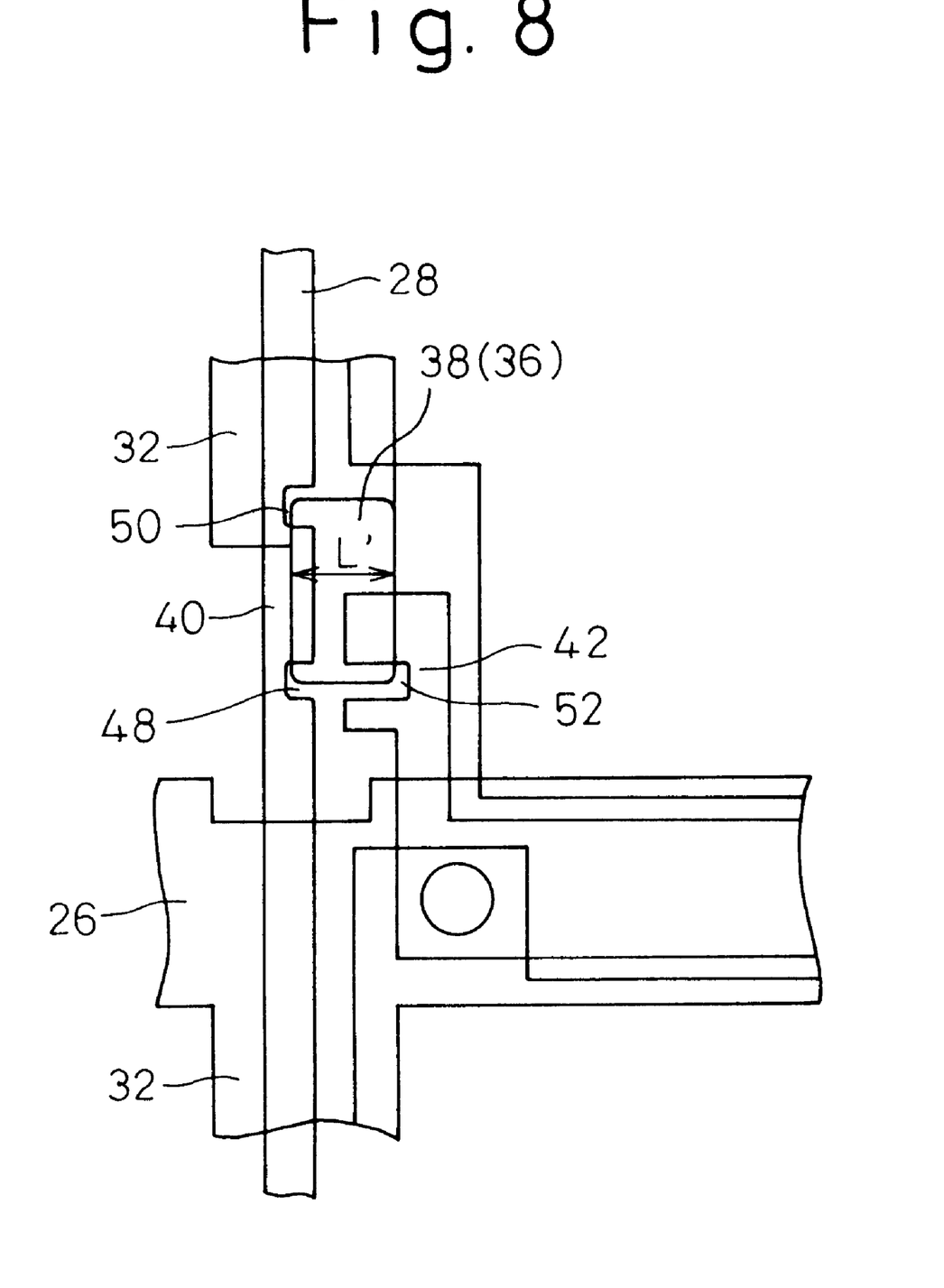
FIG. 8 is a view showing a liquid crystal display panel according to the fourth embodiment of the present invention.

FIG. 8 shows a liquid crystal display panel according to the fourth embodiment of the present invention. In this embodiment, cut-out portions 48 and 50 are provided in the drain electrode 40, while a cut-out portion 52 is provided in the source electrode 42. Accordingly, the distance L' between the drain electrode 40 and the source electrode 42 via the semiconductor active layer 36 becomes considerably larger to improve the insulation durability of the thin film transistor 30 so that the same is prevented from being destroyed due to static charge, resulting in a larger durability against electrostatic stress.

According to the embodiment shown in FIG. 8, it was found that the durability against electrostatic stress measured by the ESD tester from Advantest is 400 V under the conditions of c=200 pF and 0Ω, which is twice as good as the 200 V of the prior art. In a sample fabrication, process conditions are identical to those of conventional method except for the photo-mask. According to this embodiment, the element breakage due to static charge is reduced to a great extent. Since it is unnecessary to change the manufacturing process itself, except for the change of the pattern configuration, no problem occurs in the reliability during the application thereof and the rise in manufacturing cost is slight.

Figure 9:
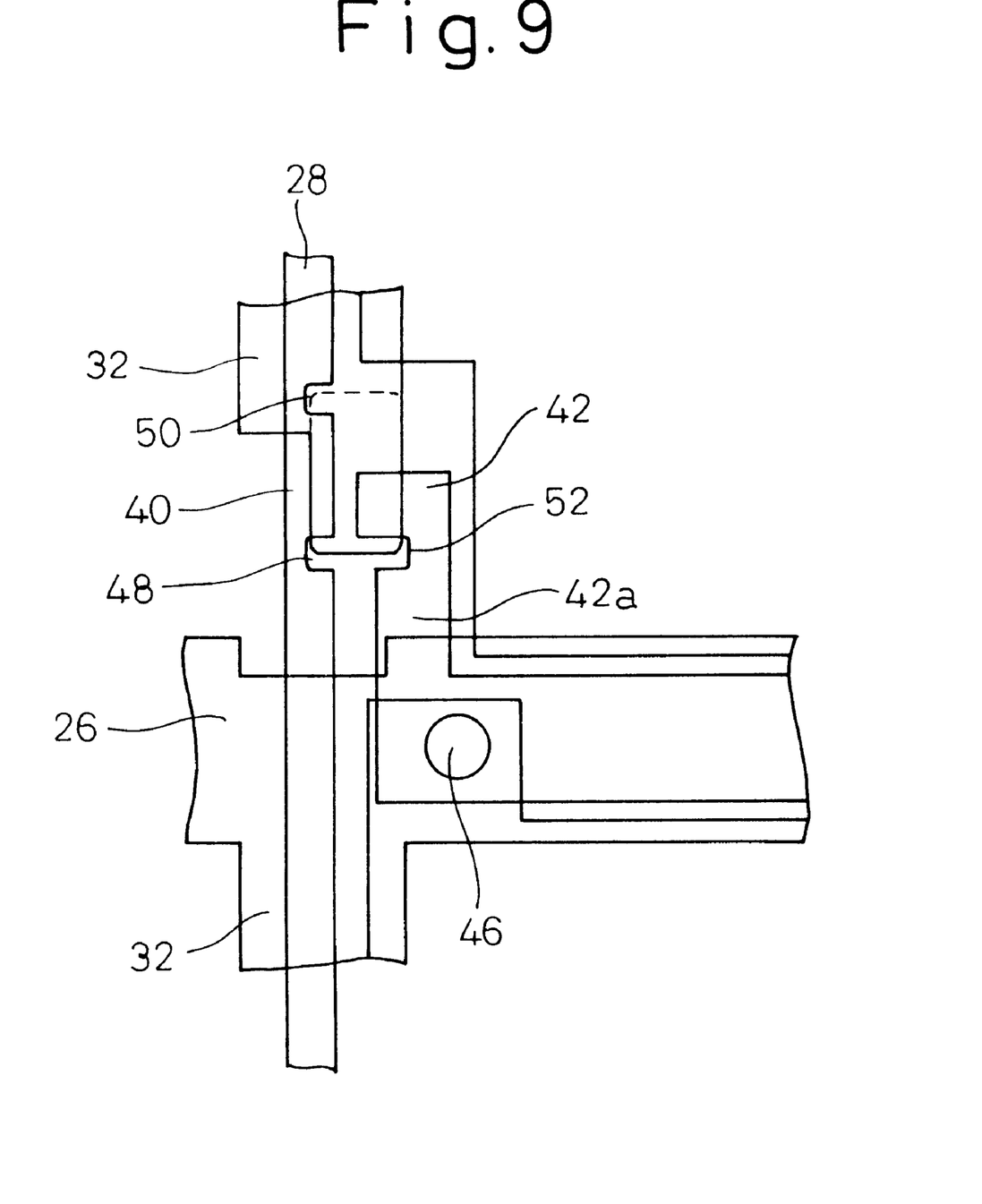
FIG. 9 is a view showing a liquid crystal display panel according to the fifth embodiment of the present invention.

FIG. 9 shows a liquid crystal display panel according to the fifth embodiment of the present invention. In this embodiment, cut-out portions 48 and 50 are provided in the drain electrode 40, while a cut-out portion 52 is provided in the source electrode 42. Further, in the cut-out portion 52 of the source electrode 42, one side wall 42a of the waisted portion 52 has the same width as that of a portion of the source electrode 42 having the contact hole 46, which width is larger than those of the embodiments shown in FIGS. 1 to 8. Therefore, the distance between the drain electrode 40 and the source electrode 42 via the semiconductor active layer 36 becomes considerably longer to improve the insulation durability or the thin film transistor 30 so that the same is prevented from being destroyed by a static charge and the resistance of the source electrode 42 is further reduced.

Figure 10:
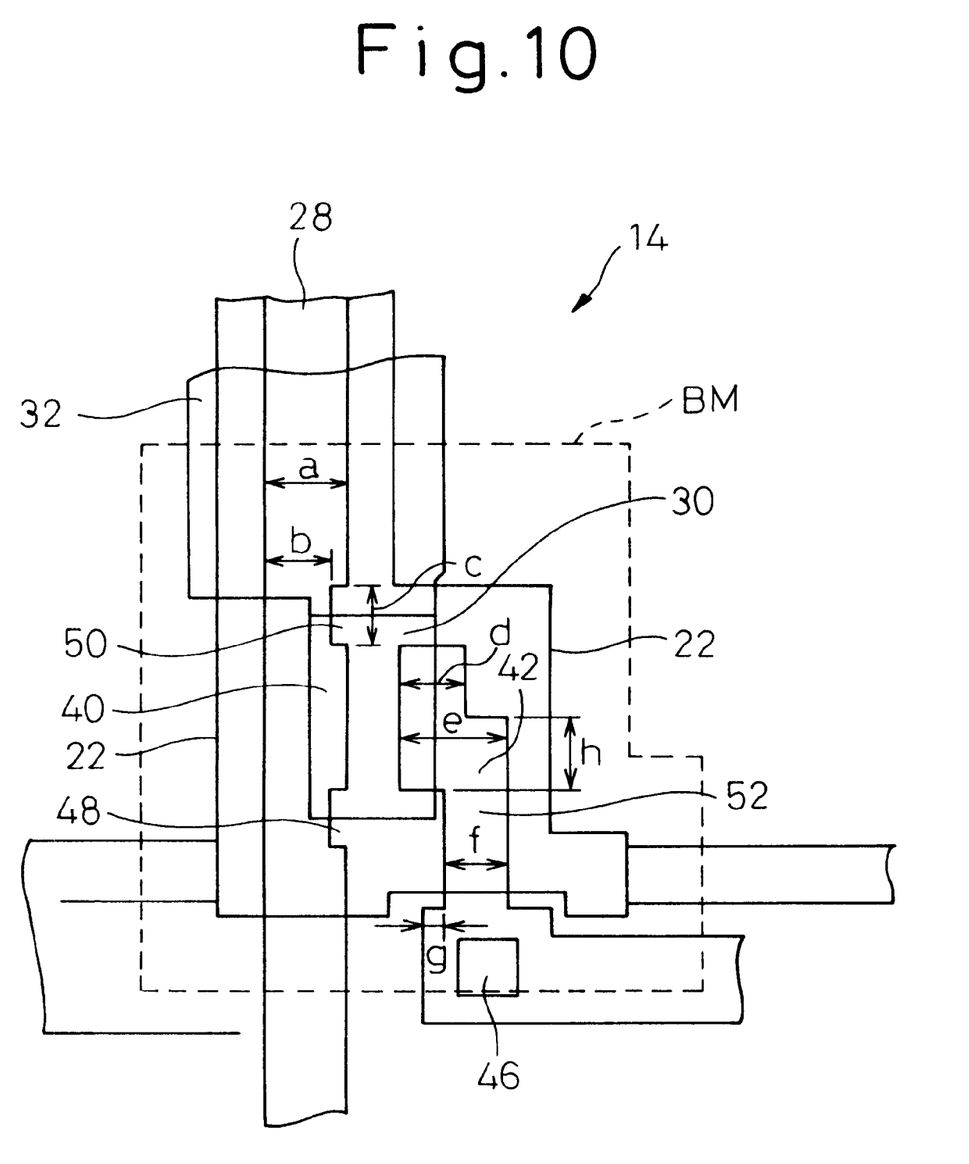
FIG. 10 is a view showing a modification of the embodiment shown in FIG. 9.

FIG. 10 shows a modification of the embodiment shown in FIG. 9. Cut-out portions 48 and 50 and 52 are provided in a similar manner to the embodiment of FIG. 9. In FIG. 10, the width "a" of the drain bus line 28 is 5 μm, and the width "b" of the drain electrode 40 in a portion having the cut-out portions 48 and 50 is 4 μm, whereby the depth of the cut-out portions 48 and 50 is 1 μm. The length "c" of the recess 48 and 50 is 4 μm. Also the width "d" of the source electrode 42 is 4 μm, the width "e" is 6.75 μm, the width "f" is 4 μm, the width "g" is 1.25 μm, and the length "h" is 5 μm. In FIG. 10, a black mask (BM) covering the thin film transistor 14 is also shown.

As described above, according to the present invention, a liquid crystal display panel having a high opening degree and a high durability against electrostatic stress can be obtained.

What is claimed is:

1. A liquid crystal display panel comprising:

a pair of substrates;

a liquid crystal interposed between the pair of substrates;

one of the pair of substrates having a plurality of gate bus lines, a plurality of drain bus lines arranged perpendicular to the gate bus lines, a plurality of pixel electrodes, and a plurality of thin film transistors;

each of the thin film transistors comprising a gate electrode connected to the gate bus line, a gate insulation layer, a semiconductor active layer, a channel protective layer, a drain electrode formed by the drain bus line, and a source electrode connected to the pixel electrode; and at least one of the drain electrode and the source electrode having at least one cut-out portion at a position overlapping with an end surface of the semiconductor active layer.

2. A liquid crystal display panel as defined by claim 1, characterized in that the drain electrode has the at least one cut-out portion at a position overlapping with an end surface of the semiconductor active layer.

3. A liquid crystal display panel as defined by claim 1, characterized in that the source electrode has the at least one cut-out portion at a position overlapping with an end surface of the semiconductor active layer.

4. A liquid crystal display panel as defined by claim 1, characterized in that both the drain electrode and the source electrode have cutout portions at positions overlapping with end surfaces of the semiconductor active layer.

5. A liquid crystal display panel as defined by claim 1, characterized in that each of the thin film transistors is arranged between two gate bus lines, the gate electrode extending from one of the gate bus lines along the drain bus line, the source electrode extending toward the other of the gate bus lines in same direction as that of the gate electrode and being connected to the pixel electrode at a position overlapping the other gate bus line.

* * * * *